United States Patent
McGee et al.

(10) Patent No.: US 6,647,134 B1
(45) Date of Patent: *Nov. 11, 2003

(54) AUTOCORRECTION OF MR PROJECTION IMAGES

(75) Inventors: Kiaran P. McGee, Rochester, MN (US); Joel Felmlee, Rochester, MN (US); Richard Ehman, Rochester, MN (US); Armando Manduca, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 575 days.

This patent is subject to a terminal disclaimer.

(21) Appl. No.: 09/595,282

(22) Filed: Jun. 15, 2000

Related U.S. Application Data

(60) Provisional application No. 60/193,119, filed on Mar. 30, 2000.

(51) Int. Cl.[7] .................................................. G06K 9/00
(52) U.S. Cl. ........................................ 382/128; 382/130
(58) Field of Search .................................. 382/128, 130

(56) References Cited

U.S. PATENT DOCUMENTS

| | | | | |
|---|---|---|---|---|
| 4,431,968 A | * | 2/1984 | Edelstein et al. | 324/309 |
| 4,567,893 A | * | 2/1986 | Charles et al. | 600/410 |
| 4,609,872 A | * | 9/1986 | O'Donnell | 324/306 |
| 4,663,591 A | * | 5/1987 | Pelc et al. | 324/309 |
| 4,665,365 A | * | 5/1987 | Glover et al. | 324/309 |
| 4,706,026 A | * | 11/1987 | Pelc et al. | 324/309 |
| 4,714,081 A | * | 12/1987 | Dumoulin et al. | 600/419 |
| 4,731,583 A | * | 3/1988 | Glover et al. | 324/309 |
| 4,937,526 A | * | 6/1990 | Ehman et al. | 324/309 |
| 4,952,877 A | * | 8/1990 | Stormont et al. | 324/312 |
| 4,992,736 A | * | 2/1991 | Stormont et al. | 324/309 |
| 5,055,789 A | * | 10/1991 | Kondo et al. | 324/309 |
| 5,204,627 A | * | 4/1993 | Mistretta et al. | 324/309 |
| 5,592,085 A | * | 1/1997 | Ehman | 324/309 |
| 5,603,323 A | * | 2/1997 | Pflugrath et al. | 600/437 |
| 5,825,186 A | * | 10/1998 | Ehman et al. | 324/309 |
| 6,263,230 B1 | * | 7/2001 | Haynor et al. | 600/424 |
| 6,329,819 B1 | * | 12/2001 | Manduca et al. | 324/309 |
| 6,400,841 B1 | * | 6/2002 | Khoury | 382/154 |

FOREIGN PATENT DOCUMENTS

WO       WO98/01828       1/1998

OTHER PUBLICATIONS

Autofocusing of Clinical Shoulder MR Images for Correction of Motion Artifacts, Mayo Clinic, Rochester MN, Manduca, et al.

Automatic Correction of Motion Artifacts in Magnetic Resonance Images Using an Entropy Focus Criterion, IEEE Transactions on Medical Imaging, vol. 16, No. 6, Dec. 1997, Atkinson, et al.

(List continued on next page.)

*Primary Examiner*—Leo Boudreau
*Assistant Examiner*—Hussein Akhavannik
(74) *Attorney, Agent, or Firm*—Quarles & Brady, LLP

(57) ABSTRACT

An MRA image is corrected for motion artifacts using an iterative, autocorrection process in which corrections are tried and the quality of the resulting reconstructed image is measured. Corrections are made to the acquired three-dimensional data while the metric which measures image quality is applied to a two-dimensional projection image.

12 Claims, 3 Drawing Sheets

OTHER PUBLICATIONS

An Autofocus Algorithm for the Automatic Correction of Motion Artifacts in MR Images, Lecture Notes in Computer Science, 15$^{th}$ International Conference, IPMI '97, Atkinson, et al.

A Respiratory Motion Artifact Reduction Method In Magnetic Resonance Imaging of the Chest, IEEE Transactions on Medical Imaging, vol. 10, No. 1, Mar. 1991, Atalar, et al.

Motion Artifact Suppression: A Review of Post–Processing Techniques, MRI, vol. 10, pp 627–635, 1992, Hedley, et al.

Diffusion–Weighted Multiple Shot Echo Planar Imaging of Humans without Navigation, MRM 38 82–88 1997, Robson, et al.

MRI Artifact Cancellation Due to Rigid Motion in the Imaging Plane, IEEE Transactions on Medical Imaging, vol. 15, No. 6, Dec. 1996, Zoroofi, et al.

An Improved Algorithm for 2–D Translation Motion Artifact Correction, IEEE Transaction on Medical Imaging, vol. 10, No. 4, Dec. 1991, Hedley, et al.

* cited by examiner

AUTOCORRECTION OF MR PROJECTION IMAGES

RELATED PATENT APPLICATION

This application claims benefit of Provisional Application Ser. No. 60/193,119 filed on Mar. 30, 2000.

BACKGROUND OF THE INVENTION

The field of the invention is nuclear magnetic resonance imaging methods and systems. More particularly, the invention relates to the correction of motion artifacts in MR images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_0$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Object motion during the acquisition of NMR image data produces both blurring and "ghosts" in the phase-encoded direction. Ghosts are particularly apparent when the motion is periodic, or nearly so. For most physiological motion each view of the NMR signal is acquired in a period short enough that the object may be considered stationary during the acquisition window. In such case the blurring and ghosting is due to the inconsistent appearance of the object from view to view. Motion that changes the appearance between views such as that produced by a patient moving, by the respiration or the cardiac cycle, or by peristalsis, is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view. The drawback of gating is that NMR data may be acquired only during a small fraction of the object's functional cycle, and even when the shortest acceptable pulse sequence is employed, the gating technique can significantly lengthen the data acquisition.

Another proposed method for eliminating ghost artifacts is disclosed in U.S. Pat. No. 4,567,893, issued on Feb. 4, 1986. This prior patent teaches that the distance in the image between the ghosts and the object being imaged is maximized when the NMR pulse sequence repetition time is an odd multiple of one-fourth of the duration of the periodic signal variation. This can be used to alleviate ghosts due to respiratory motion. While this method, indeed, improves image quality, it does impose a constraint on the NMR pulse sequence repetition time and it often results in a longer total scan time. It also assumes that the motion is periodic.

Yet another method for reducing the undesirable effects due to periodic signal variations is disclosed in U.S. Pat. No. 4,706,026 issued on Nov. 10, 1987 and entitled "A Method For Reducing Image Artifacts Due To Periodic Variations In NMR Imaging." In one embodiment of this method, an assumption is made about the signal variation period (e.g. due, for example, to patient respiration) and the view order is altered from the usual monotonically increasing phase-encoding gradient to a preselected order. For a given signal variation period, a view order is chosen so as to make the NMR signal variation as a function of the phase-encoding amplitude be at a desired frequency. In one embodiment, the view order is selected such that the variation period appears to be equal to the total NMR scan time (low frequency) so that the ghost artifacts are brought as close to the object being imaged as possible. In another embodiment (high frequency), the view order is chosen to make the variation period appear to be as short as possible so as to push the ghost artifacts as far from the object as possible.

This prior method is effective in reducing artifacts, and is in some respects ideal if the variation is rather regular and at a known frequency. On the other hand, the method is not very robust if the assumption made about the motion temporal period does not hold (e.g., because the patient's breathing pattern changes or is irregular). If this occurs, the method loses some of its effectiveness because the focusing of the ghosts, either as close to the object or as far from the object as possible, becomes blurred. A solution to this problem is disclosed in U.S. Pat. No. 4,663,591 which is entitled "A Method For Reducing Image Artifacts Due To Periodic Signal Variations in NMR Imaging." In this method, the non-monotonic view order is determined as the scan is executed and is responsive to changes in the period so as to produce a desired relationship (low frequency or high frequency) between the signal variations and the gradient parameter. The effectiveness of this method, of course, depends upon the accuracy of the means used to sense the patient motion, and particularly, any variations in the periodicity of that motion.

Yet another method for reducing motion artifacts in NMR images is referred to in the art as "gradient moment nulling". This method requires the addition of gradient pulses to the pulse sequence which cancel, or null, the effect on the NMR signal phase caused by spins moving in the gradients employed for position encoding. Such a solution is disclosed, for example, in U.S. Pat. No. 4,731,583 entitled "Method For Reduction of NMR Image Artifacts Due To Flowing Nuclei By Gradient Moment Nulling".

The most successful method for correcting MR images for motion artifacts employs navigator signals acquired during the scan. As described in U.S. Pat. No. 4,937,526, such navigator signals are acquired periodically during the scan, and the information in these signals may be used to correct the image data for patient. motion. Unfortunately, acquisition of the navigator signals increases the scan time.

An automatic correction method has been proposed by D. Atkinson et al., "Information Processing in Medical Imaging", P.341–354, 1997 in which the entropy of the reconstructed image is examined as a focus criterion by which to iteratively adjust motion estimate. This prior method, due to the properties of entropy, works mostly by making dark areas as dark as possible (thus removing ghosting), but does not use much information from the bright areas of the image. While this method works well on simple test images, clinical MR images often do not become as sharp as they should be and the processing time may be very long.

As disclosed in co-pending PCT application Ser. No. PCT/US99/08123 filed on Apr. 14, 1999, and entitled "Autocorrection of MR Images for Motion Artifacts" improvements in the autocorrection process have been made which make it a clinically useful method for correcting medical images. This autocorrection method is an iterative process in which phase corrections are made to acquired NMR data, an image is reconstructed from the corrected data, and the quality of the image is evaluated using a chosen metric. This process repeats until the corrections have improved image quality to a preset level.

SUMMARY OF THE INVENTION

The present invention is a method for correcting images derived from image data acquired with an MRI system to form a k-space image data set; reconstructing an image from the k-space image data set; producing a derivative image by processing the reconstructed image; evaluating the quality of the derivative image by calculating a cost function based on the derivative image; and minimizing the cost function by making corrections to k-space views and repeating the steps.

A general object of the invention is to extend the autocorrection process to correct images that are derived from acquired MRI data. Producing clinically useful images from a reconstructed MR image requires further processing that may result in a derivative image that is linearly or non-linearly related to the acquired MR image. It has been discovered that the autocorrection process can be extended to evaluate the final, derived image.

A more specific object of the invention is to correct two dimensional projection images produced from acquired three-dimensional MR data. The projection process produces a two-dimensional image which is non-linearly related to the acquired MR data. Nevertheless, the autocorrection process according to the present invention converges to an image with substantially reduced motion artifacts.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
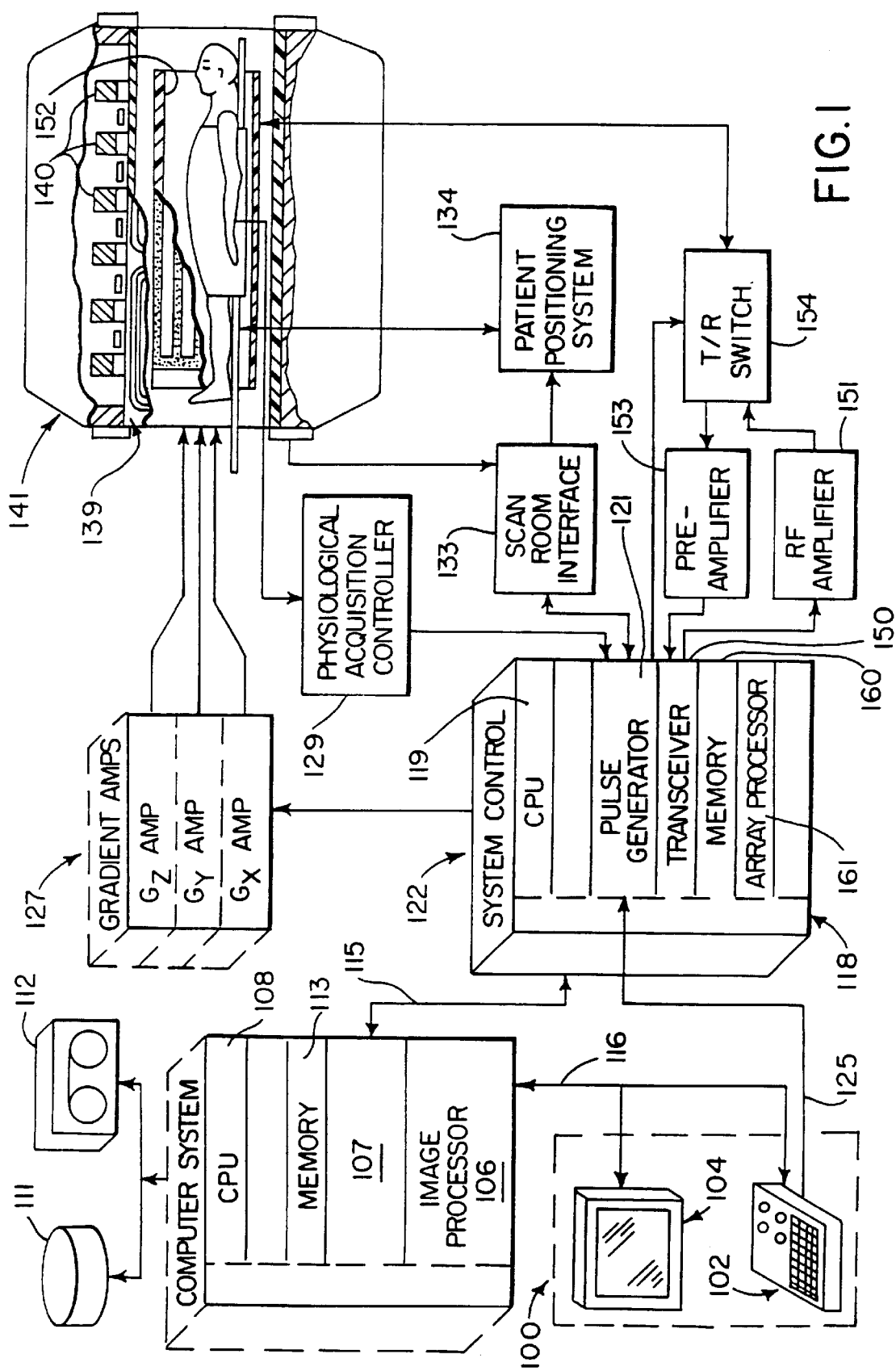
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

While the present invention can be used on many different types of medical images, the preferred application is in MR angiography. The preferred embodiment of the invention employs a 3D gradient recalled echo pulse sequence depicted in FIG. 3. The pulse sequence "3dfgre" available on the General Electric 1.5 Tesla MR scanner sold under the trademark "SIGNA" was used.

Figure 3:
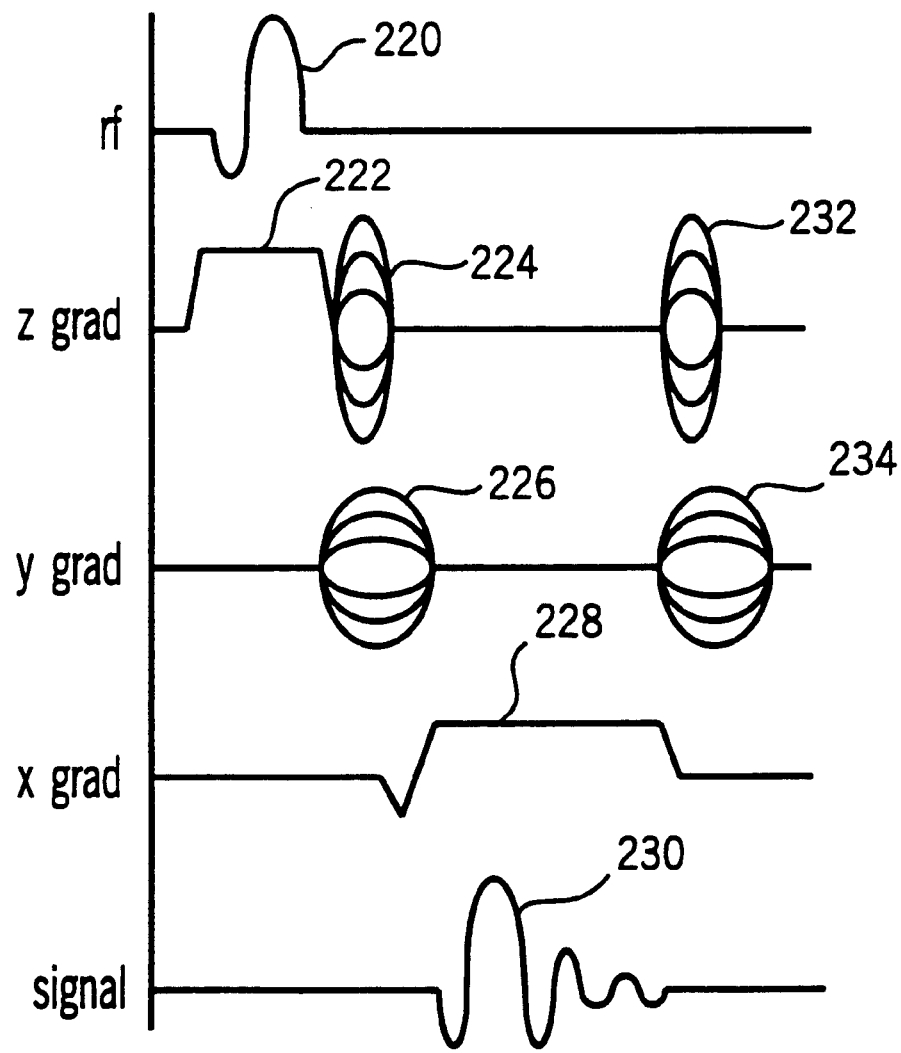
FIG. 3 is a graphic representation of a pulse sequence used in the MRI system of FIG. 1 to acquire three-dimensional MRA data.

Referring particularly to FIG. 3, an RF excitation pulse 220 having a flip angle of 60° is produced in the presence of a slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365.

As is well known in the art, the pulse sequence is repeated and the phase encoding pulses 224 and 226 are stepped through a series of values to sample the 3D k-space. In the preferred embodiment sixteen phase encodings are employed along the z axis and 128 phase encodings are employed along the y axis. For each particular y phase encoding, therefore, sixteen acquisitions with twelve different z phase encodings are performed to sample completely along the $k_z$ axis. This is repeated 128 times with 128 different y phase encodings to sample completely along the $k_y$ axis.

Sampling along the $k_x$ axis is performed by sampling the echo signal 230 in the presence of the readout gradient pulse 228 during each pulse sequence. It will be understood by those skilled in the art that only a partial sampling along the $k_x$ axis is performed and the missing data is computed using a homodyne reconstruction or by zero filling. This enables the echo time (TE) of the pulse sequence to be shortened to less than 1.8 to 2.0 ms. and the pulse repetition rate (TR) to be shortened to less than 10.0 msecs.

Figure 2:
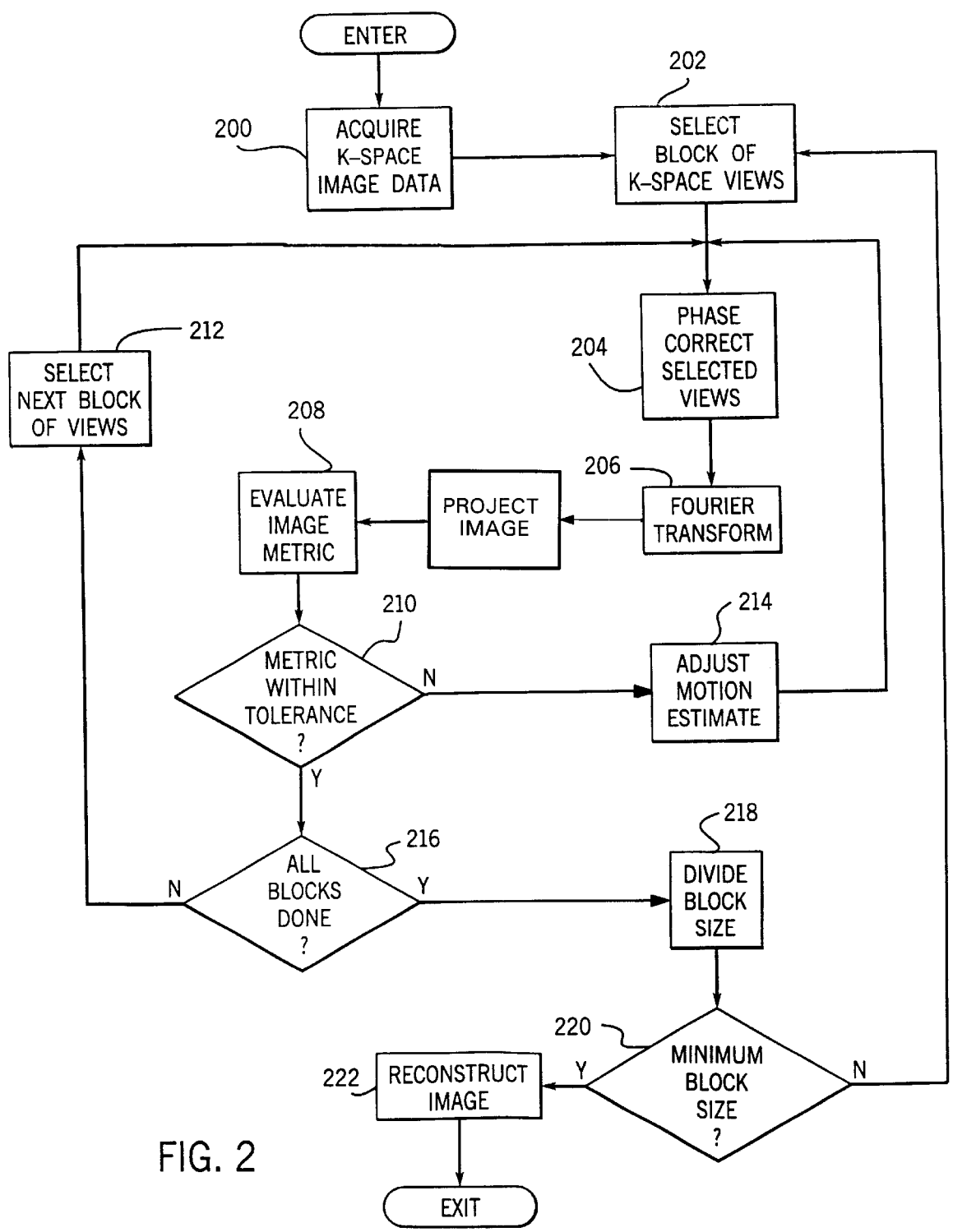
FIG. 2 is a flow chart of the preferred autocorrection method employed by the MRI system of FIG. 1.

The autocorrection method is employed to reduce image artifacts in k-space image data sets acquired with the MRI system of FIG. 1. Referring particularly to FIG. 2, after a three-dimensional k-space image data set is acquired as indicated at process block 200, an initial block of k-space views is selected for correction as indicated at process block 202. In the preferred embodiment 64 views are selected in this initial block. The views in this block are then phase shifted as indicated at process block 204 based on an initial motion estimate.

The altered three-dimensional k-space data set is then Fourier transformed as indicated at process block 206 to produce a three-dimensional image. While images may be produced simply by selecting a set of data points located in a cross section through one of the 3D data arrays 250–255, such images have limited diagnostic value. This is because blood vessels usually do not lie in a single plane and such cross sectional images show only short pieces or cross sections of many vessels that happen to pass through the selected plane. Such images are useful when a specific location in a specific vessel is to be examined, but they are less useful as a means for examining the health of the vascular system and identifying regions that may be diseased.

For assessing overall blood vessel structure and health it is more useful to project the 3D array of NMR data into a single 2D projection image to produce an angiogram-like picture of the vascular system. The most commonly used technique for doing this is to project a ray from each pixel in the projection image through the array of data points and select the data point which has the maximum value. The value selected for each ray is used to control the brightness of its corresponding pixel in the projection image. This method, referred to hereinafter as the "maximum pixel technique," is very easy to implement and it gives aesthetically pleasing images. It is presently the preferred method.

Another technique which may be used to form a projection image and which retains more of the available information is what is referred to as the "integration method". This projection method is described in U.S. Pat. No. 5,204,627 entitled "Adaptive NMR Angiographic Projection Method", and with this method, the brightness of each projection image pixel is determined by the sum of all the data points along the projection ray.

Yet another technique used to produce projection images uses a 3D region-growing method. The origins of the regions in the 3D data set to be grown are operator determined. The grown regions are then blurred and thresholded to create a mask which includes voxels just outside the vessel edges, which may have been omitted in the region-growing process. This method gives a very smooth representation of the vasculature in which vessel edges are retained and vessel overlap can be deduced by use of visual cues which are included in the rendering process.

As indicated at process block 208, the image metric is then calculated using this projection image and the entropy of the gradient metric $F_1$.

$$F_1 = -\sum_{ij} h_{ij} \log_2[h_{i,j}] \tag{1}$$

where:

$$h_{i,j} = \sum_{ij} \left( \frac{\left\| \begin{bmatrix} 1 \\ -1 \end{bmatrix} * g_{i,j} \right\|}{\sum_{ij} \left\| \begin{bmatrix} 1 \\ -1 \end{bmatrix} * g_{i,j} \right\|} \right)$$

If the calculated metric $F_1$ is within a preset tolerance as determined at decision block 210, the block of 64 views has been corrected and the next block of 64 views is selected as indicated at process block 212 and the process repeats. Otherwise, the motion estimate for this block is adjusted at process block 214 and the process is repeated to evaluate the image metric with the corresponding adjusted phase shift.

All blocks of k-space views are separately adjusted in phase starting at the center of k-space and working outward. When the last block has been corrected as determined at decision block 216, the block size is reduced in size as indicated at process block 218 and the system branches back to process block 202 to repeat the steps on the smaller block size. The process is repeated and the block size is reduced until the minimum block size has been processed as determined at decision block 220. In the preferred embodiment block size is divided by two after each iteration, and the minimum block size is one view. The corrected k-space data set is then Fourier transformed to reconstruct an optimal image as indicated at process block 222.

It should be apparent that the autocorrection method can be employed on one, two or three axes of motion. In many clinical applications of the method, it has been discovered that processing only a single axis of motion is necessary. This reduces the processing time considerably. For example, if the motion is primarily along the phase encoding direction, a one dimensional FFT along the readout gradient direction can be performed once on the acquired k-space image data set before the projection and autocorrection method is applied. The phase corrections in process 204 are made on this hybrid-space data set and the Fourier transform in process 206 can be a one-dimensional FFT along the phase encoding gradient direction.

Also, in many clinical applications only a small portion of the reconstructed image is clinically important. The autocorrection method may be modified in this situation to evaluate the image metric in process block 208 only in the selected region of interest. That is, the operator identifies the pixels in the region of interest and the image metric is calculated only on these pixels. This reduces processing time and in some cases improves the resulting image in the critical region. This also enables the correction of images in which the motion is different in different regions of the image. In such cases each region may be separately corrected using the autocorrection method. Simple, non-global motions of this type can be corrected, for example, in MR angiography where the motions are not complex.

For example, the complete image may contain 256 columns of pixels which must be Fourier transformed each time the metric is to be calculated. If the region selected by the operator extends over only 64 columns of pixels, then only those 64 columns need be Fourier transformed during each evaluation iteration. This reduces the processing time by a factor of four.

The present invention can also be used to correct other MR errors. For example, errors caused by gradient non-idealities in echo-planar imaging (EPI) acquisitions, or saturation variations due to variations in TR when imaging using cardiac gating can be corrected.

The present invention also enables the autocorrections to be applied locally rather than globally to the entire image. Thus, local regions in the image can be separately corrected to further reduce processing time and tailor the correction to the particular motion in that region.

While the present invention is particularly applicable to correct projection MR angiograms, it is also applicable to other clinical MRI applications where the final image is different than the acquired image. For example, many different images may be produced from acquired MR elastography image data as disclosed in U.S. Pat. Nos. 5,592,085 and 5,825,186. Functional MR images may be produced from acquired MR image data as described in U.S. Pat. No. 5,603,323 and diffusion weighted images may be produced from acquired MR image data as described in U.S. Pat. No. 4,609,872. These and other methods produce a final image which is different than the image reconstructed from the acquired MR data, and it is a teaching of the present invention that the cost function employed in the autocorrection process may be calculated based on this final image. This is true even when the final image is non-linearly related to the reconstructed image.

We claim:

1. A method for correcting an MRA image for artifacts, the steps comprising:

a) acquiring a series of views using a magnetic resonance imaging system that performs a three-dimensional imaging pulse sequence to form a three-dimensional image data set;

b) reconstructing a three-dimensional image from the acquired three-dimensional image data set;

c) projecting the three-dimensional image onto a two-dimensional projection plane to form a two-dimensional projection image;

d) evaluating the quality of the reconstructed image by calculating a cost function based on the two-dimensional projection image; and e) iteratively minimizing the cost function by making corrections to views in the three-dimensional image data set and repeating steps b), c), d) and e).

2. The method as recited in claim 1 in which the three-dimensional image is reconstructed by performing a Fourier transformation.

3. The method as recited in claim 1 in which the artifacts are caused by patient motion.

4. The method as recited in claim 1 which includes selecting a region in the image which is to be corrected and performing steps c), d) and e) on the selected region.

5. The method as recited in claim 4 in which only a portion of the image containing said selected region is reconstructed in step b).

6. The method as recited in claim 4 which includes selecting a second region in the image which is to be corrected and performing steps c), d) and e) on the second region.

7. The method as recited in claim 1 in which the cost function is calculated by:

calculating the gradient of the two-dimensional projection image; and calculating the entropy of the resulting gradient image.

8. The method as recited in claim 1 in which the cost function is iteratively minimized in step e) by:

i) making corrections to each of a plurality of blocks of views and repeating steps b), c) and d) until the cost function is minimized for each block;

ii) reducing the number of views in each block and repeating step i); and iii) repeating step ii) until the number of views in the block reaches a minimum.

9. The method as recited in claim 8 in which the minimum is one view per block.

10. A method for correcting an image for artifacts; the steps comprising:

a) acquiring a series of views using a magnetic resonance imaging system that performs an imaging pulse sequence to form a k-space image data set;

b) reconstructing an image by Fourier transforming the k-space image data set;

c) producing a derivative image by processing the reconstructed image;

d) evaluating the quality of the derivative image by calculating a cost function based on the derivative image; and e) iteratively minimizing the cost function by making corrections to views in the k-space image data set and repeating steps b), c), d) and e).

11. The method as recited in claim 10 in which the derivative image produced in step c) is non-linearly related to the reconstructed image.

12. The method as recited in claim 10 in which the reconstructed image is a three-dimensional image and the derivative image is a two-dimensional projection image.

* * * * *